(12) United States Patent
Kobayashi et al.

(10) Patent No.: US 10,090,350 B2
(45) Date of Patent: Oct. 2, 2018

(54) LIGHT RECEIVING DEVICE

(71) Applicant: Panasonic Intellectual Property Management Co., Ltd., Osaka (JP)

(72) Inventors: Masato Kobayashi, Shiga (JP); Manabu Usuda, Hyogo (JP); Toshitaka Akahoshi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 30 days.

(21) Appl. No.: 15/292,512

(22) Filed: Oct. 13, 2016

(65) Prior Publication Data

US 2017/0033142 A1    Feb. 2, 2017

Related U.S. Application Data

(63) Continuation of application No. PCT/JP2015/001975, filed on Apr. 8, 2015.

(30) Foreign Application Priority Data

Apr. 18, 2014    (JP) .................................. 2014-086009

(51) Int. Cl.
*H01L 27/146* (2006.01)
*H01L 21/56* (2006.01)
(Continued)

(52) U.S. Cl.
CPC ...... *H01L 27/14634* (2013.01); *H01L 21/563* (2013.01); *H01L 27/1469* (2013.01);
(Continued)

(58) Field of Classification Search
None
See application file for complete search history.

(56) References Cited

U.S. PATENT DOCUMENTS

| 5,515,411 A | 5/1996 | Tonami et al. |
| 2006/0043297 A1 | 3/2006 | Ouvrier-Buffet et al. |
| (Continued) | | |

FOREIGN PATENT DOCUMENTS

| JP | 61-280659 A | 12/1986 |
| JP | H07-063859 A | 3/1995 |
| (Continued) | | |

OTHER PUBLICATIONS

International Search Report issued in Application No. PCT/JP2015/001975 dated Jun. 30, 2015, with English translation.

*Primary Examiner* — Charles Garber
*Assistant Examiner* — Xiaoming Liu
(74) *Attorney, Agent, or Firm* — McDermott Will & Emery LLP

(57) ABSTRACT

A light receiving device includes: a photoelectric converter including a photodiode and a first pixel electrode disposed on a lower surface of the photodiode; a scanning circuit connected to the first pixel electrode; an electrode pad disposed on a periphery of the scanning circuit; a transparent conductive film extending from an upper surface of the photodiode to the electrode pad, the transparent conductive film having an inclination relative to the upper surface of the photodiode, between the photodiode and the electrode pad; and a sealing resin filled in a space between the photoelectric converter and the scanning circuit, and in a space under the transparent conductive film around the photoelectric converter.

8 Claims, 8 Drawing Sheets

(51) Int. Cl.
*H01L 31/0224* (2006.01)
*H01L 31/0203* (2014.01)
*H01L 31/107* (2006.01)

(52) U.S. Cl.
CPC .. *H01L 27/14618* (2013.01); *H01L 27/14623* (2013.01); *H01L 27/14636* (2013.01); *H01L 31/0203* (2013.01); *H01L 31/022466* (2013.01); *H01L 31/107* (2013.01); *H01L 2224/49175* (2013.01)

(56) References Cited

U.S. PATENT DOCUMENTS

| | | | |
|---|---|---|---|
| 2009/0108181 A1* | 4/2009 | Ishihara | H01L 27/14623 250/214.1 |
| 2011/0049591 A1 | 3/2011 | Nakatani et al. | |
| 2011/0049661 A1* | 3/2011 | Maehara | H01L 27/307 257/432 |
| 2011/0192458 A1* | 8/2011 | Doi | H01G 9/2077 136/256 |
| 2012/0161270 A1 | 6/2012 | Maehara et al. | |
| 2012/0305926 A1 | 12/2012 | Nakatani et al. | |

FOREIGN PATENT DOCUMENTS

| | | |
|---|---|---|
| JP | H07-192663 A | 7/1995 |
| JP | H08-204166 A | 8/1996 |
| JP | 2000-241556 A | 9/2000 |
| JP | 2005-539218 A | 12/2005 |
| JP | 2006-049512 A | 2/2006 |
| JP | 2009-111090 A | 5/2009 |
| JP | 2011-071483 A | 4/2011 |

* cited by examiner

LIGHT RECEIVING DEVICE

CROSS REFERENCE TO RELATED APPLICATIONS

This application is a U.S. continuation application of PCT International Patent Application Number PCT/JP2015/001975 filed on Apr. 8, 2015, claiming the benefit of priority of Japanese Patent Application Number 2014-086009 filed on Apr. 18, 2014, the entire contents of which are hereby incorporated by reference.

BACKGROUND

1. Technical Field

The present disclosure relates to a light receiving device that converts incident light into an electrical signal, and, in particular, to a light receiving device including a semiconductor scanning circuit for reading the signal charge converted from the incident light by a photodiode having a photoelectric conversion function.

2. Description of the Related Art

A light receiving device has been conventionally developed and commercialized, in which a photodiode of a photoelectric converter and a scanning element that transfers photoelectric charges generated by the photodiode are integrated on a semiconductor substrate.

In the conventional light receiving device, the photodiode and the scanning element are disposed on the same plane. Hence, the aperture ratio (the ratio of the amount of light incident on the photoelectric converter to the amount of light incident on the light receiving surface) is small. This results in low light use efficiency and large loss of incident light.

Although development of an on-chip microlens, for example, has increased the substantial aperture ratio, increase in the substantial aperture ratio is limited as long as the photodiode and the scanning element are disposed on the same plane.

In view of the above, a light receiving device has been proposed in which a photodiode for generating photoelectric charges are stacked on the scanning circuit substrate for photoelectric charge transfer.

Since the photodiode serving as a light receiving portion is disposed on the entire surface of the scanning circuit in the light receiving device, the light receiving device can have an aperture ratio close to 100%, which leads to increased sensitivity.

In order to achieve good optical response characteristics, such a light receiving device generally has an electrode which contacts the photodiode in such a manner that charge injection is blocked.

Therefore, in a light receiving device which does not use charge multiplication within the device, it is not possible to take out the signal charges exceeding the number of carriers generated by incident light. This results in the gain of the photoelectric conversion being one or less.

In view of the above, a light receiving device having a photoelectric conversion gain exceeding one, an avalanche multiplication type light receiving device has been developed. In this device, an avalanche multiplication phenomenon is generated by applying a strong electric field to the photodiode to make the gain of the photoelectric conversion one or greater.

In such an avalanche multiplication type light receiving device, the gain which is the ratio of the number of photoelectric charges generated within the photodiode to the number of incident photons ranges from several dozen to several hundred.

The stacked light receiving device described above is formed by forming, on a silicon substrate, a scanning circuit through the semiconductor processes used for a general integrated circuit and sequentially depositing a photodiode and a transparent conductive film on the scanning circuit.

In this case, before the transparent conductive film is formed on the scanning circuit, the scanning circuit is formed through complicated processes performed on a silicon substrate. Hence, it is extremely difficult to smooth the surface of the scanning circuit before the transparent conductive film is formed, which results in that the pixel electrode itself or the boundary of the pixel electrode has unevenness.

Therefore, for example, unlike a photoconductive type image pickup tube where a photoconductive film is formed on a smooth glass substrate, dark current increases due to a local electric field concentration caused by unevenness of the base, which is likely to lead to white spot defects appearing on the screen.

In particular, if it is desired to obtain high sensitivity by using the avalanche multiplication phenomenon in a photodiode, it is necessary to apply a strong electric field to the photodiode. Hence, local dark current injection or avalanche breakdown due to non-uniformity of the electric field is likely to occur.

As a conventional technique for solving the above problems, for example, Japanese Unexamined Patent Application No. H7-192663 (hereinafter, referred to as patent literature (PTL) 1) discloses a structure in which a photoelectric converter, including a transparent conductive film and a photodiode formed on a light transmitting substrate, is connected, via conductive microbumps, to signal reading electrodes of a scanning circuit formed on a substrate different from the light transmitting substrate.

FIG. 9 is a cross-sectional view of a photoelectric converter of a conventional light receiving device. Transparent conductive film 103 and, photodiode 104 are formed on light transmitting substrate 113. First pixel electrodes 105 having a predetermined size are arranged on the surface of photodiode 104 at predetermined intervals. Second pixel electrodes 107 are provided on the surface of scanning circuit 108 at the same pitch as first pixel electrodes 105. Microbumps 106 for electrically connecting photoelectric converter 101 and scanning circuit 102 are provided on second pixel electrodes 107.

As illustrated in FIG. 9, the light receiving device according to the conventional technique has a structure where photoelectric converter 101 and scanning circuit 102 separately formed are electrically connected by microbumps 106 as described above.

In the conventional technique, for example, a substrate which is polished to have a sufficiently flat surface is used. Accordingly, photodiode 104 is formed on a significantly flat base.

Thus, for example, even if a light receiving device is operated by applying, to a photodiode, a high electric field which causes charge multiplication in the photodiode due to an avalanche phenomenon, an increase in dark current or an avalanche breakdown due to local electric field concentration is unlikely to occur.

Moreover, since scanning circuit 102 and photoelectric converter 101 are formed separately, the materials for second pixel electrodes 107 on scanning circuit 108 and for photodiode 104 can be selected without considering the electrical connection characteristics of second pixel electrodes 107 and photodiode 104.

In other words, optimal materials, structures, and manufacturing methods can be used without any constraints imposed by being a stacked image capturing device.

Therefore, in such a stacked structure using the microbumps, for example, as a substrate on which a photodiode is formed, an SOI (Silicon On Insulator) substrate is used which has a silicon oxide film disposed between a silicon substrate and a surface silicon layer. The SOI substrate is effective for a reduction in parasitic capacitance of a transistor, an increase in operating speed, and a reduction in power consumption. Silicon and the silicon oxide film are removed after stacking the scanning circuit and the microbumps, and a transparent conductive film is formed. In this way, the characteristics of the photodiode can be further improved.

SUMMARY

However, when the light receiving device is operated by applying, to a photodiode, a high electric field which causes charge multiplication in the photodiode due to an avalanche phenomenon, a voltage needs to be supplied to the transparent conductive film on the photodiode. However, PTL 1 does not mention how to supply the voltage, and thus, users are not sure of how to supply the voltage.

Japanese Unexamined Patent Application No. 2005-539218 (hereinafter, referred to as PTL 2) discloses a structure for supplying a voltage to a transparent conductive film. For example, as illustrated in FIG. 10, transparent conductive film 103 is connected to electrode pad 110 of scanning circuit 102 to allow external voltage application.

However, when transparent conductive film 103 is formed at the stepped portions of housing 114 in the above structure, transparent conductive film 103 may be thinner at the side wall portion than at the upper surface portion depending on the processing method. Non-uniform thickness of transparent conductive film 103 leads to unstable voltage supply, making it difficult to provide desired charge multiplication effects and high sensitivity.

Additionally, there is a risk of breakage/disconnection of the transparent conductive film due to stress concentration at the corner of the housing.

In order to solve the above problems, the light receiving device according to an aspect of the present disclosure includes: a photoelectric converter including a photodiode and a pixel electrode disposed on a lower surface of the photodiode; a scanning circuit connected to the pixel electrode; an electrode pad disposed on a periphery of the scanning circuit; and a transparent conductive film extending from an upper surface of the photodiode to the electrode pad, the transparent conductive film having an inclination relative to the upper surface of the photodiode, between the photodiode and the electrode pad.

In the light receiving device according to an aspect of the present disclosure, the transparent conductive film is not bent sharply at the corner of the edge of the upper surface of the photoelectric converter. Hence, it is possible to reduce disconnection of the transparent conductive film due to stress concentration at the corner.

Moreover, since the transparent conductive film has a uniform thickness on the upper and side surfaces of the photoelectric converter, stable voltage supply can be provided. As a result, a highly sensitive sensor with less image unevenness can be provided.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Hereinafter, embodiments for carrying out the present disclosure will be described with reference to the drawings. However, detailed descriptions may be omitted. For example, detailed descriptions of well-known aspects or repetitive descriptions of essentially similar configurations may be omitted. This is to avoid redundancy and make the following description easier for those skilled in the art to understand.

Note that the accompanying drawings and the following description are provided not to limit the subject matter of the claims, but to aid those skilled in the art to adequately understand the present disclosure.

Embodiment 1

Figure 1:
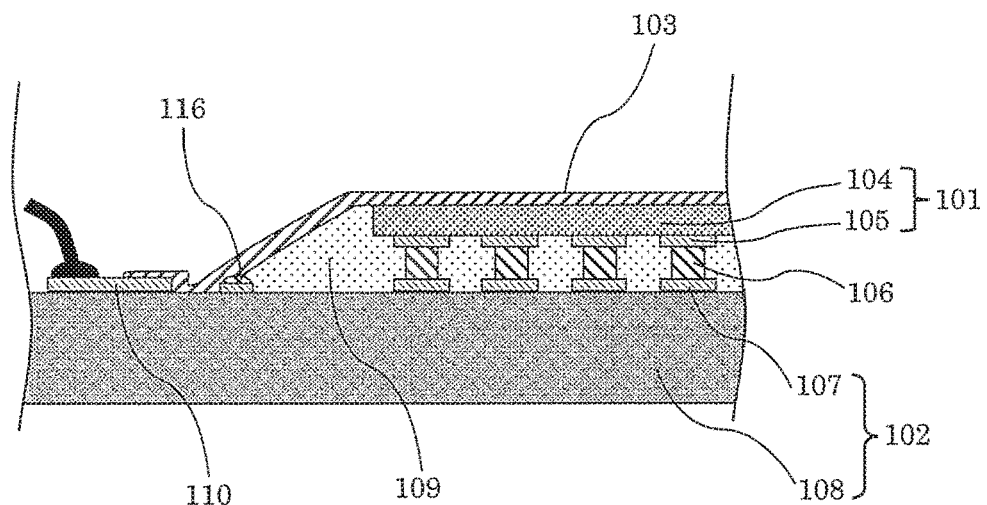
FIG. 1 is a cross-sectional view of a light receiving device according to Embodiment 1.

FIG. 1 is a cross-sectional view of a light receiving device according to Embodiment 1 (a cross-sectional view taken along line 1-1 in FIG. 2 to be described later). The light receiving device includes photoelectric converter 101, scanning circuit 102, and microbumps 106. Photoelectric converter 101 and scanning circuit 102 are stacked via microbumps 106. In other words, the light receiving device is a so-called stacked device.

The light receiving device according to Embodiment 1 illustrated in FIG. 1 will be described in more detail. Photoelectric converter 101 includes: photodiode 104; and first pixel electrodes 105 having a predetermined size and arranged on photodiode 104 at predetermined intervals. Scanning circuit 102 includes: second pixel electrodes 107 formed at the same pitch as first pixel electrodes 105; electrode pads 110; and dummy bumps 116 formed between second pixel electrodes 107 and electrode pads 110. First pixel electrodes 105 and second pixel electrodes 107 are connected by microbumps 106. Sealing resin 109 is formed in the space around microbumps 106. Sealing resin 109 forms a smooth fillet extending from dummy bump 116 and reaching the upper surface of photodiode 104. That is, sealing resin 109 surrounding photoelectric converter 101 has a fillet shape inclined relative to the upper surface of photodiode 104. The fillet reaches the edge of the upper surface of photodiode 104. Transparent conductive film 103 is formed on photodiode 104 and the fillet of sealing resin 109. Transparent conductive film 103 is connected to at least two electrode pads 110 on scanning circuit 102.

As described above, transparent conductive film 103 extends from the upper surface of photodiode 104 to electrode pads 110, and has an inclination relative to the upper surface of photodiode 104, between photodiode 104 and electrode pad 110. In particular, the surface of sealing resin 109 between the edge of photodiode 104 and electrode pad 110 is inclined relative to the upper surface of photodiode 104 at 45 degrees or less. That is, the inclination of transparent conductive film 103 relative to the upper surface of photodiode 104 is at 45 degrees or less.

According to the light receiving device above, sealing resin 109 provided between photoelectric converter 101 and electrode pads 110 which are provided on the semiconductor substrate has an inclination. Hence, transparent conductive film 103 is not bent sharply at the corner of the edge of the upper surface of photoelectric converter 101. This reduces disconnection of transparent conductive film 103 due to stress concentration at the edge of the upper surface of photoelectric converter 101.

Moreover, transparent conductive film 103 can have a uniform thickness on the upper and side surfaces of photoelectric converter 101. This allows voltage to be stably supplied, leading to a highly sensitive light receiving device with less image unevenness.

Figure 2:
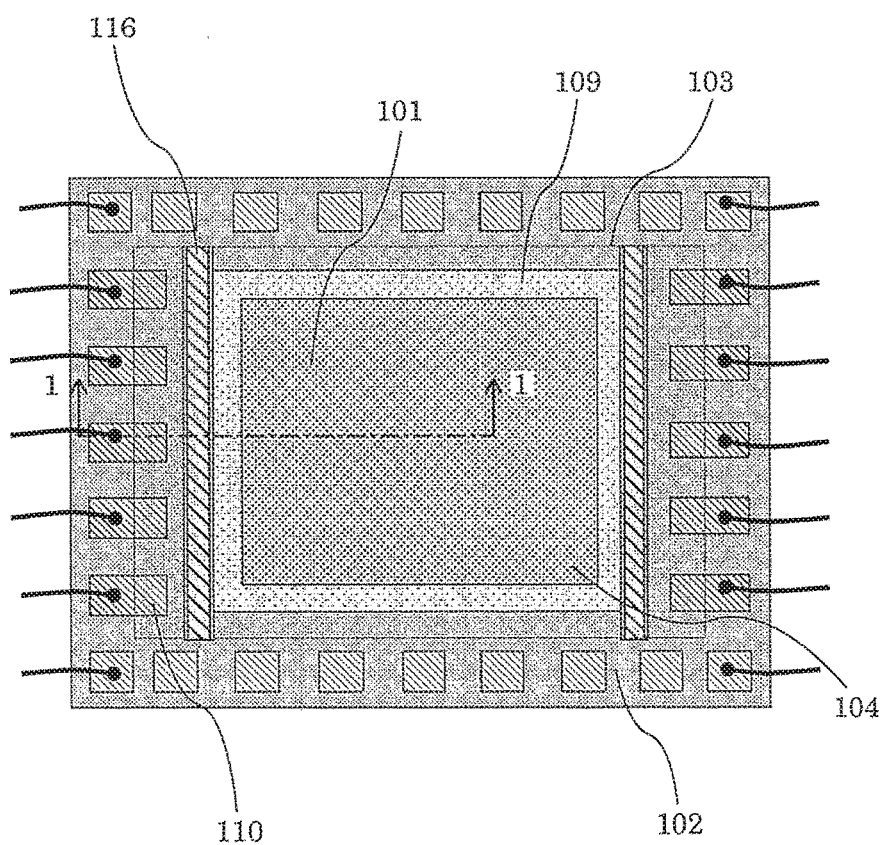
FIG. 2 is a top view of the light receiving device according to Embodiment 1.

FIG. 2 is a top view of the light receiving device according to Embodiment 1. Sealing resin 109 surrounds photoelectric converter 101. Transparent conductive film 103 entirely covers photoelectric converter 101 and sealing resin 109, and is connected to electrode pads 110 on scanning circuit 102.

In photoelectric converter 101, photodiode 104 is formed, for example, on an SOI substrate.

Scanning circuit 102 includes, on a per pixel basis, a MOS transistor formed on a semiconductor substrate made of, for example, silicon materials. The MOS transistor includes a charge storage unit, a charge reading unit, and a gate electrode.

Transparent conductive film 103 includes, for example; tin oxide ($SnO_2$) containing antimony or fluorine as a dopant; zinc oxide (ZnO) containing aluminum, gallium, indium, or tin as a dopant; or indium oxide ($In_2O_3$) containing tin, tungsten, or titanium as a dopant. An indium oxide film containing tin as a dopant, that is, $In_2O_3$—Sn based film, referred to as ITO (Indium Tin Oxide) film, is particularly preferable materials for transparent conductive film 103 as the ITO film easily leads to a transparent conductive film with a low resistance. Although an epoxy-based or acryl-based underfill resin, for example, is used for sealing resin 109, but the materials for sealing resin 109 are not limited to such examples. Sealing resin 109 is formed in the light of wettability and the like so that dummy bumps 116 prevent sealing resin 109 from reaching electrode pads 110 on scanning circuit 102.

Microbumps 106 are formed on first pixel electrodes 105 and second pixel electrodes 107 as bumps (projecting electrodes) having a height ranging from several μm to several dozen μm. Note that microbumps 106 can be manufactured by several ways including plating process and photolithography process.

The materials for microbumps 106 are required to be conductive materials with a resistance that is as low as possible. Examples of the low-resistance metal materials include Sn, Cu, Au, Ni, Co, Pd, Ag, and In. Examples of the structure of microbumps 106 include a single layer structure including any one of the above metal materials, a multilayer structure of layers of different metal materials, and a structure including an alloy of the above metal materials.

Moreover, as micro bumps 106, a paste formed by mixing the conductive particles in an adhesive may be used. Examples of such a paste include (i) Ag paste or Ag—Pd paste printed on a reading electrode and (ii) metal, such as Au, elemental In, and alloyed In etc. having good ductility and high adhesion, formed on a reading electrode in a pillar shape or a conical shape. As microbumps 106, a conductive paste may also used. The structure under the bumps may be, for example, an Al or SiN film as long as a seed layer can be formed.

FIG. 3A to FIG. 3D are cross-sectional views in respective manufacturing processes of the light receiving device according to Embodiment 1.

Figure 3A:
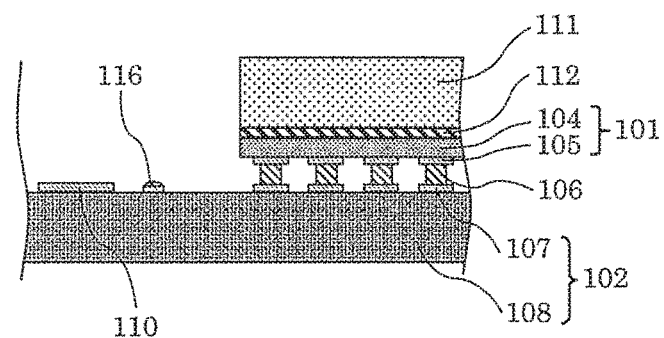
FIG. 3A is a cross-sectional view of a manufacturing process of the light receiving device according to Embodiment 1.

As illustrated in FIG. 3A, first, the positions of dummy bumps 116 on scanning circuit 102 and microbumps 116 on the pixel electrodes of scanning circuit 102 and photoelectric converter 101 including photodiode 104 formed over silicon substrate 111 and silicon oxide film 112 are adjusted to desired positions. After that, microbumps 106 on the pixel electrodes of scanning circuit 102 and microbumps 106 on the pixel electrodes of photoelectric converter 101 are brought into contact with each other and connected to each other.

Figure 3B:
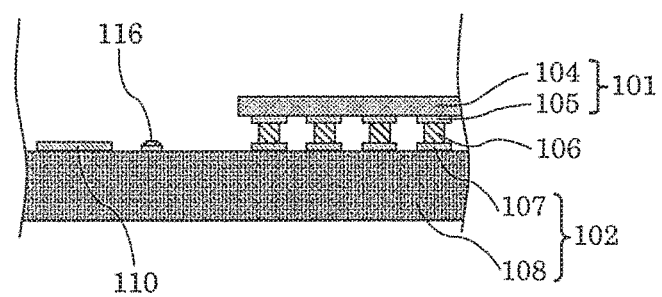
FIG. 3B is a cross-sectional view of the manufacturing process of the light receiving device according to Embodiment 1.

Next, as illustrated in FIG. 3B, silicon substrate 111 and silicon oxide film 112 are removed by a wet process or a dry process, to expose photodiode 104.

Figure 3C:
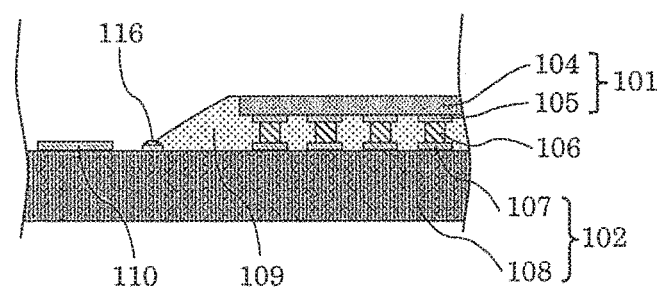
FIG. 3C is a cross-sectional view of the manufacturing process of the light receiving device according to Embodiment 1.

Next, as illustrated in FIG. 3C, for example, epoxy-based sealing resin 109 is injected to the peripheral edge portion of photoelectric converter 101 and, a space between photoelectric converter 101 and scanning circuit 102, and is cured at a constant temperature to be resin molded.

Figure 3D:
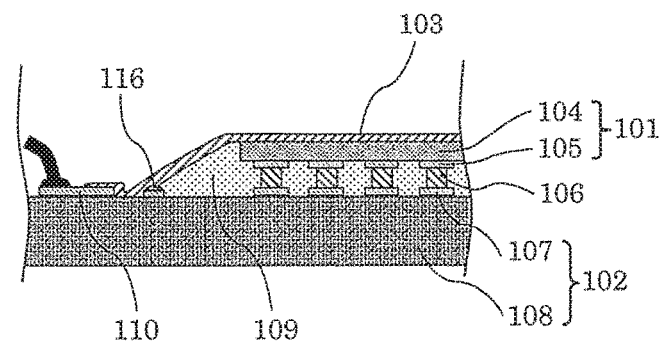
FIG. 3D is a cross-sectional view of the manufacturing process of the light receiving device according to Embodiment 1.

Next, as illustrated in FIG. 3D, transparent conductive film 103 is formed over photodiode 104, the fillet of sealing resin 109, and scanning circuit 102 by vapor deposition. Subsequently, an unnecessary portion of transparent conductive film 103 is removed, and unremoved transparent conductive film 103 is connected to electrode pads 110 on scanning circuit 102.

According to the light receiving device described above, sealing resin 109 provided between photoelectric converter 101 and electrode pads 110 which are provided on a semiconductor substrate has an inclination. Hence, transparent conductive film 103 is not bent sharply at the corner of the edge of the upper surface of photoelectric converter 101. This reduces disconnection of transparent conductive film 103 due to stress concentration at the edge of the upper surface of photoelectric converter 101.

Moreover, transparent conductive film 103 can have a uniform thickness on the upper and side surfaces of photoelectric converter 101. This allows voltage to be stably supplied, leading to a highly sensitive light receiving device with less image unevenness.

(Variation)

Figure 4:
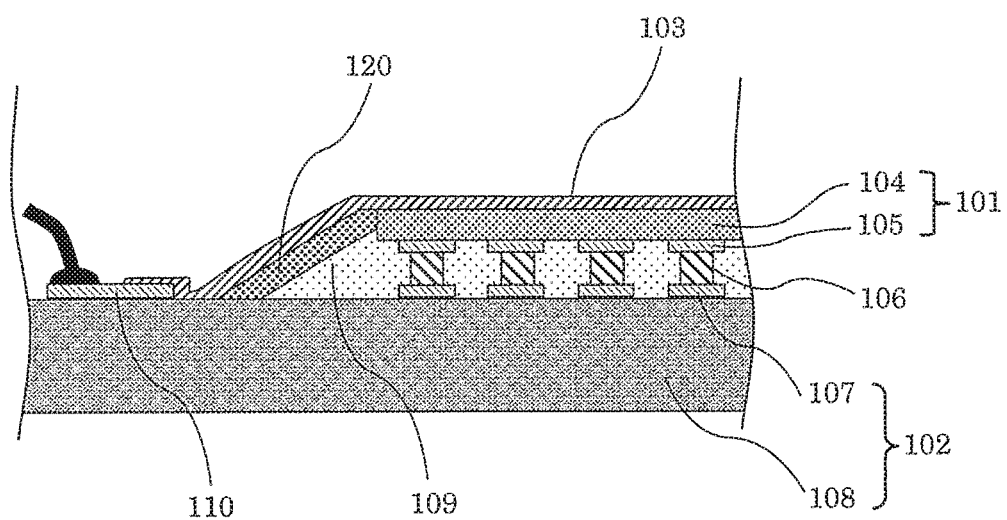
FIG. 4 is a cross-sectional view of a light receiving device according to Variation of Embodiment 1.

FIG. 4 is a cross-sectional view of a light receiving device according to Variation of Embodiment 1. Transparent conductive film 103 is formed on, instead of sealing resin 109 forming a fillet, a side surface of housing 120 which has an opening at the position corresponding to the upper surface of photodiode 104 and which surrounds photoelectric converter 101. Transparent conductive film 103 is connected to electrode pads 110 on the periphery of scanning circuit 102. Housing 120 is provided on scanning circuit 102. Housing 120 has a side surface which has an inclination relative to the upper surface of photodiode 104, in particular, at 45 degrees or less.

As described above, in the light receiving device according to Variation, scanning circuit 102 has housing 120. Housing 120 has a side surface surrounding photoelectric converter 101 and having an inclination relative to the upper surface of photodiode 104. Transparent conductive film 103 is formed on the side surface of housing 120.

With this structure, the same advantageous effects as the light receiving device according to Embodiment 1 can be obtained. Moreover, with this structure, housing 120 allows transparent conductive film 103 having a desired inclination to be more reliably formed.

Embodiment 2

Figure 5:
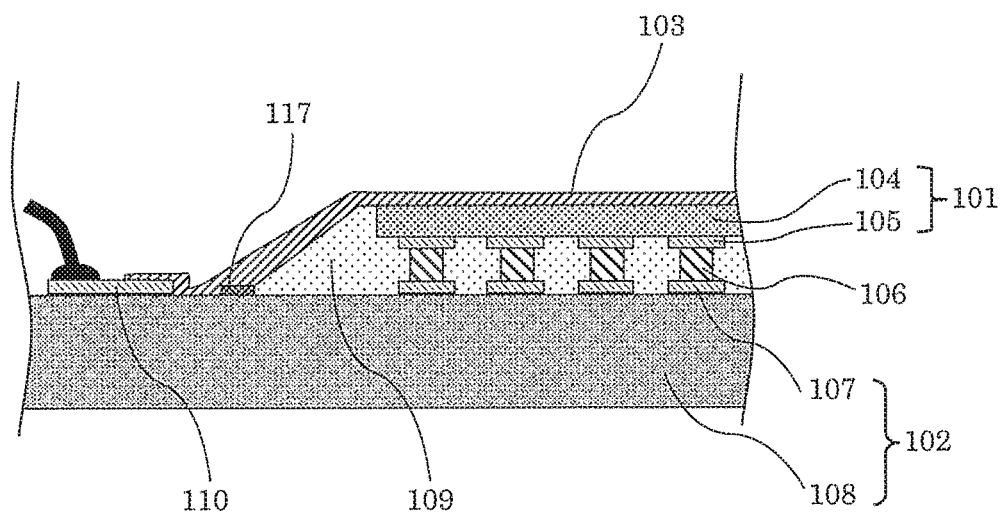
FIG. 5 is a cross-sectional view of a light receiving device according to Embodiment 2.

FIG. 5 is across-sectional view of a light receiving device according to Embodiment 2.

Protective film 117 is formed instead of dummy bumps 116 according to Embodiment 1, so that sealing resin 109 does not reach electrode pads 110 on scanning circuit 102.

Figure 6:
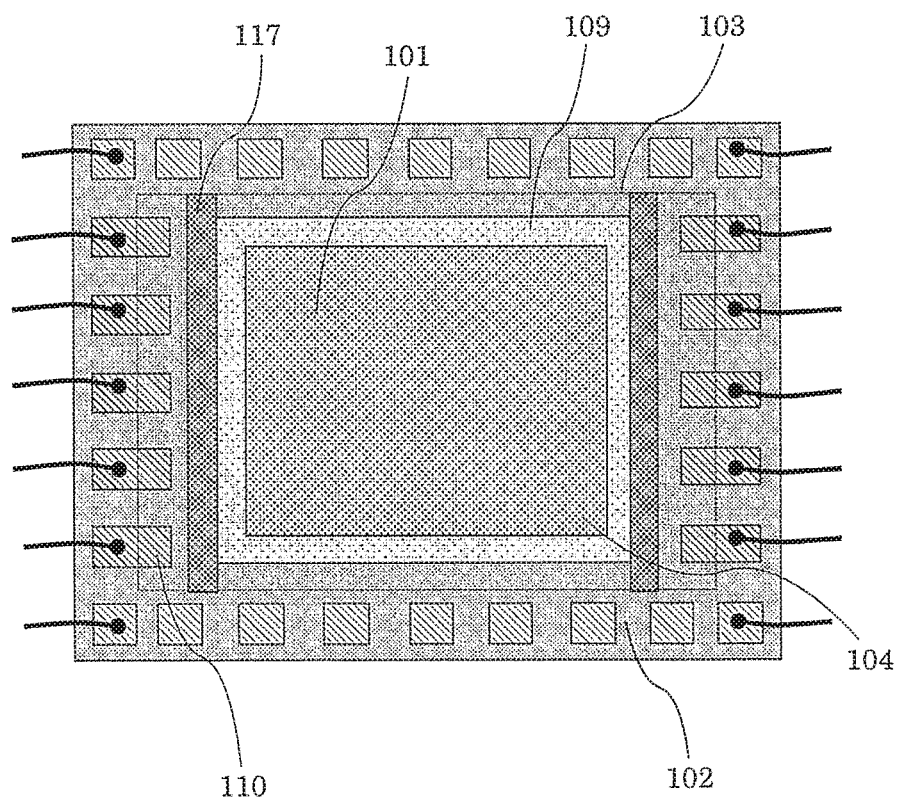
FIG. 6 is a top view of the light receiving device according to Embodiment 2.

FIG. 6 is a top view of the light receiving device according to Embodiment 2. Sealing resin 109 surrounds photoelectric converter 101. Transparent conductive film 103 entirely covers photoelectric converter 101 and sealing resin 109, and is connected to electrode pads 110 on scanning circuit 102.

Photolithography and etching are performed on the outermost surface protective film of scanning circuit 102 using a gray-scale mask, so that the protective film has a projection. Since protective film 117 is simultaneously formed when etching the protective film on electrode pads 110, the number of processes does not increase.

Sealing resin 109 forms a smooth fillet extending from protective film 117 to the edge of the upper surface of photodiode 104. The inclination of the fillet relative to the main surface of scanning circuit 102 is at 45 degrees or less.

According to the structure in Embodiment 2, the same advantageous effects as the light receiving device according to Embodiment 1 can be obtained.

Embodiment 3

Figure 7:
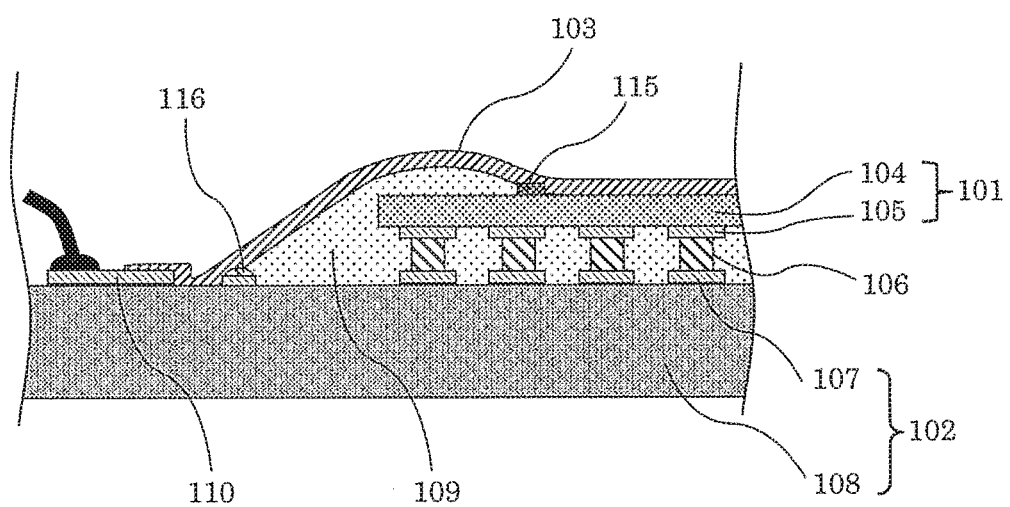
FIG. 7 is a cross-sectional view of a light receiving device according to Embodiment 3.

FIG. 7 is a cross-sectional view of a light receiving device according to Embodiment 3.

The light receiving device according to Embodiment 3 has a stacked device structure where first pixel electrodes 105 of photoelectric converter 101 and second pixel electrodes 107 of scanning circuit 102 are connected via microbumps 106. Sealing resin 109 is formed from dummy bump 116 to the space around microbumps 106. Sealing resin 109 extends over silicon nitride film 115 on the upper surface of photoelectric converter 101.

The area over which silicon nitride film 115 extends is an optical black area which defines the level of "black" of a pixel value. Sealing resin 109 has a light shielding effect for photodiode 104. In other words, sealing resin 109 serves as a light shielding film. Moreover, stress concentration can be further alleviated by sealing resin 109 covering the corner edge portion which is a part of the upper surface of photoelectric converter 101 (photodiode 104).

Sealing resin 109 forms a smooth fillet extending from dummy bump 116 to the upper surface of photodiode 104. The inclination of the fillet relative to the main surface of scanning circuit 102 is at 45 degrees or less.

FIG. 8A to FIG. 8D are cross-sectional views in respective manufacturing processes of the light receiving device according to Embodiment 3.

Figure 8A:
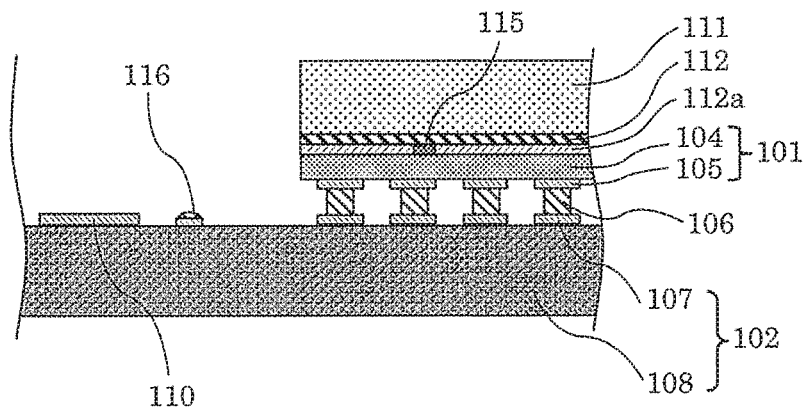
FIG. 8A is a cross-sectional view of a manufacturing process of a light receiving device according to Embodiment 3.

As illustrated in FIG. 8A, first, the positions of dummy bump 116 on scanning circuit 102 and microbumps 106 on the pixel electrodes of photoelectric converter 101 and scanning circuit 102 are adjusted to desired positions. After that, microbumps 106 on the pixel electrodes of photoelectric converter 101 and microbumps 106 on the pixel electrodes of scanning circuit 102 are brought into contact with each other and connected to each other. Here, photoelectric converter 101 including photodiode 104 and first pixel electrodes 105 is formed on silicon oxide film 112a into which silicon nitride film 115 is embedded. Silicon oxide film 112a is formed on silicon oxide film 112. Silicon oxide film 112 is formed on silicon substrate 111.

Figure 8B:
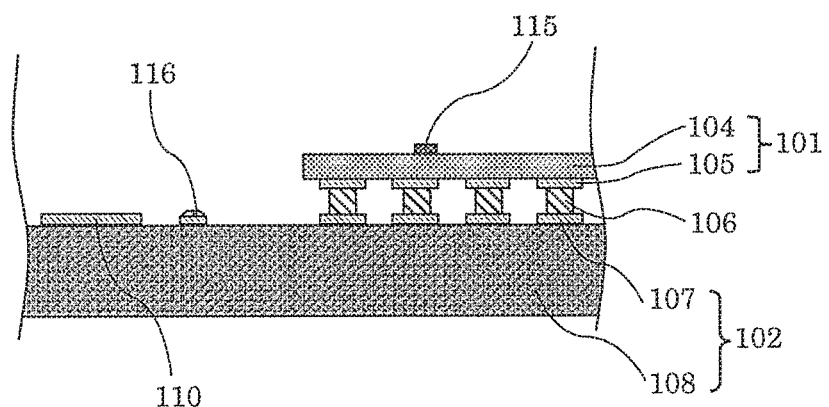
FIG. 8B is a cross-sectional view of the manufacturing process of the light receiving device according to Embodiment 3.

Next, as illustrated in FIG. 8B, silicon substrate 111, silicon oxide film 112, and silicon oxide film 112a are removed by wet etching or dry etching, to expose photodiode 104. Silicon nitride film 115 is left on the upper surface of photodiode 104 due to a difference in etching rate.

Figure 8C:
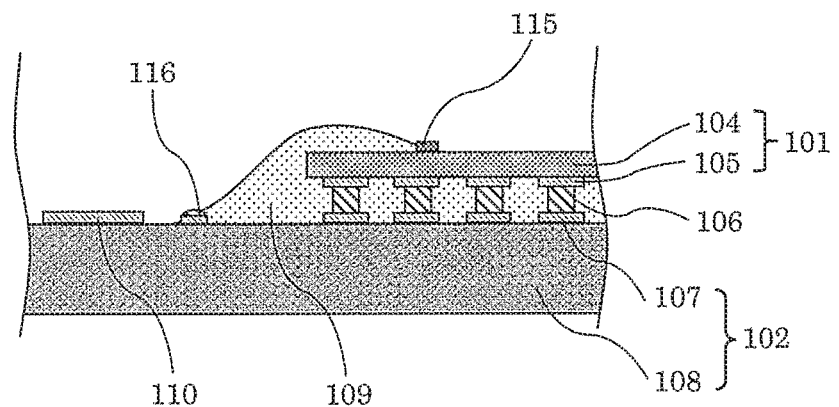
FIG. 8C is a cross-sectional view of the manufacturing process of the light receiving device according to Embodiment 3.

Next, as illustrated in FIG. 8C, for example, epoxy-based sealing resin 109 is injected to the peripheral edge portion of photoelectric converter 101 and a space between photoelectric converter 101 and scanning circuit 102, and covers the upper surface of photoelectric converter 101 to the position where silicon nitride film 115 is, and is cured at a constant temperature to be resin molded.

Figure 8D:
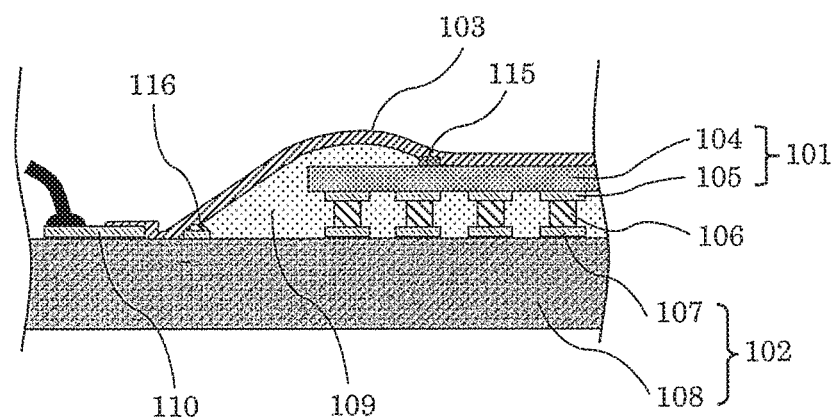
FIG. 8D is a cross-sectional view of the manufacturing process of the light receiving device according to Embodiment 3.
Figure 9:
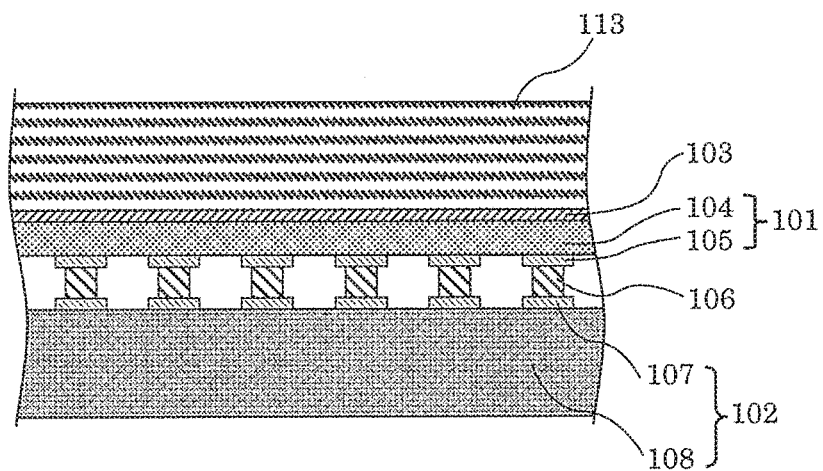
FIG. 9 is a cross-sectional view of a photoelectric converter of a light receiving device according to a conventional technique.
Figure 10:
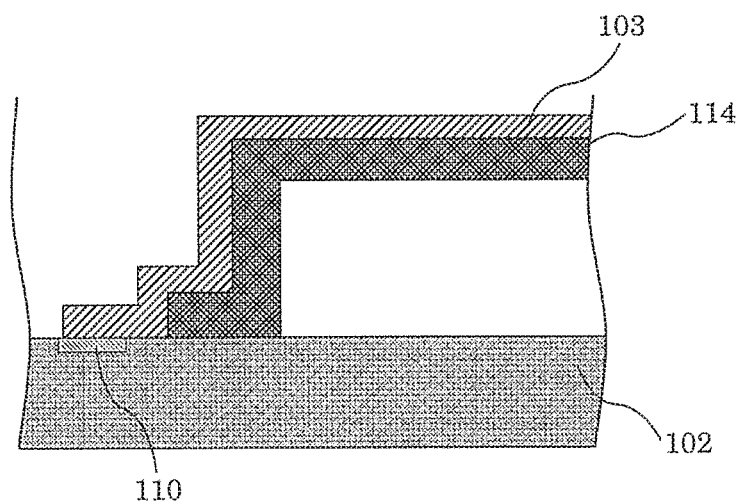
FIG. 10 is a cross-sectional view of the photoelectric converter of the light receiving device according to a conventional technique.

Next, as illustrated in FIG. 8D, transparent conductive film 103 is formed over photodiode 104, the fillet of sealing resin 109, and scanning circuit 102 by vapor deposition. Subsequently, an unnecessary portion of transparent conductive film 103 is removed, and unremoved transparent conductive film 103 is connected to electrode pads 110 on scanning circuit 102.

With the structure according to Embodiment 3, the same advantageous effects as the light receiving device according to Embodiment 1 can be obtained.

In Embodiments 1 to 3 and Variation above, the light receiving device may further include a unit for applying, to photodiode 104, a voltage having a magnitude which causes charge multiplication effect in photodiode 104. In other words, photodiode 104 may be an avalanche diode.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to, for example, a light receiving device required to have a small size, high performance, high sensitivity, and low cost.

What claimed is:

1. A light receiving device comprising:
a photoelectric converter including a photodiode and a pixel electrode disposed on a lower surface of the photodiode;
a scanning circuit connected to the pixel electrode;
an electrode pad disposed on a periphery of the scanning circuit;
a transparent conductive film extending from an upper surface of the photodiode to the electrode pad, the transparent conductive film having an inclination relative to the upper surface of the photodiode, between the photodiode and the electrode pad; and
a sealing resin filled in a space between the photoelectric converter and the scanning circuit, and in a space under the transparent conductive film around the photoelectric converter,
wherein the sealing resin does not reach the electrode pad on the scanning circuit.

2. The light receiving device according to claim 1, wherein the inclination of the transparent conductive film relative to the upper surface of the photodiode is at 45 degrees or less.

3. The light receiving device according to claim 1,
wherein the scanning circuit includes a housing,
the housing has a side surface surrounding the photoelectric converter and having an inclination relative to the upper surface of the photodiode, and
the transparent conductive film is formed on the side surface of the housing.

4. The light receiving device according to claim 1, wherein the pixel electrode and the scanning circuit are connected by a microbump.

5. The light receiving device according to claim 4, wherein the sealing resin reaches an edge of the upper surface of the photodiode.

6. The light receiving device according to claim 4, wherein the sealing resin partially covers the upper surface of the photodiode.

7. The light receiving device according to claim 6, wherein the sealing resin partially covering the upper surface of the photodiode has a light shielding effect for the photodiode.

8. The light receiving device according to claim 1, further comprising a unit for applying, to the photodiode, a voltage having a magnitude which causes a charge multiplication effect in the photodiode.

* * * * *